United States Patent [19]

Fukui et al.

[11] 4,315,274

[45] Feb. 9, 1982

[54] THYRISTOR WITH SWITCHABLE CAPACITOR BETWEEN AUXILIARY THYRISTOR CATHODE AND MAIN THYRISTOR GATE REGIONS

[75] Inventors: Hiroshi Fukui; Shin Kimura, both of Hitachi, Japan

[73] Assignee: Hitachi, Ltd., Tokyo, Japan

[21] Appl. No.: 160,567

[22] Filed: Jun. 17, 1980

Related U.S. Application Data

[63] Continuation of Ser. No. 904,771, May 11, 1978, abandoned.

[30] Foreign Application Priority Data

May 23, 1977 [JP] Japan .................................. 52-58833

[51] Int. Cl.³ ............................................. H01L 29/74
[52] U.S. Cl. ......................................... 357/38; 357/51; 357/86; 307/252 A; 307/305

[58] Field of Search .............................. 357/38, 86, 51; 307/252 A, 252 C, 305

[56] References Cited

U.S. PATENT DOCUMENTS

| | | | |
|---|---|---|---|
| 3,641,404 | 2/1972 | Svedberg | 307/252 A |
| 4,110,638 | 8/1978 | Voss | 307/252 A |
| 4,115,794 | 9/1978 | De LaMoneda | 357/51 |

*Primary Examiner*—Joseph E. Clawson, Jr.
*Attorney, Agent, or Firm*—Thomas E. Beall, Jr.

[57] ABSTRACT

A thyristor comprising a main thyristor and an auxiliary thrysitor, wherein a capacitor is connected between the cathode electrode of the auxiliary thyristor and the gate electrode of the main thyristor so that electrical or thermal injury or breakdown in the auxiliary thyristor and in the vicinity thereof can be prevented and that the di/dt capability of the thyristor can be increased.

7 Claims, 17 Drawing Figures

F I G. 5a
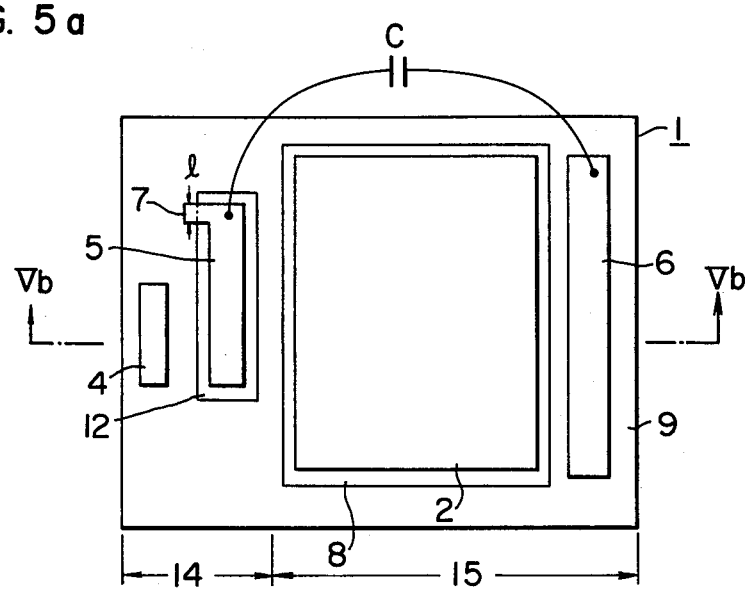
F I G. 5b
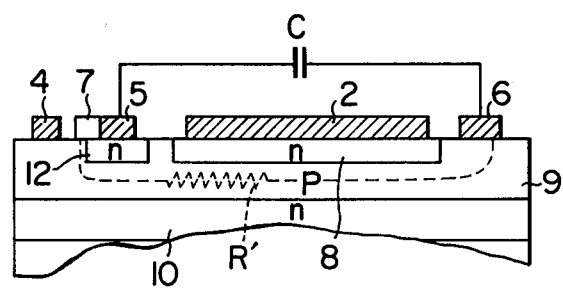

THYRISTOR WITH SWITCHABLE CAPACITOR BETWEEN AUXILIARY THYRISTOR CATHODE AND MAIN THYRISTOR GATE REGIONS

This is a continuation of application Ser. No. 904,771 filed May 11, 1978, now abandoned.

BACKGROUND OF THE INVENTION

1. Field of the Invention

This invention relates to a thyristor having an amplifying gate structure and more particularly to a thyristor having a large di/dt capability (current rise rate capability) at the transient period of turn-on.

2. Description of the Prior Art

When a forward voltage is applied between the anode and the cathode electrode of a thyristor and a triggering signal voltage is applied between the gate and the cathode electrodes of the thyristor, the resulting current (gate current) flowing between the gate and the cathode electrode causes the thyristor, which was cut off until then in the forward direction, to turn conductive. The shift of the thyristor from cut-off to conductive state is referred to as the turn-on of the thyristor. The turn-on of the thyristor takes place in the following manner. Namely, the resulting gate current first turns on a small area of the thyristor which is nearest to the gate electrode and on the periphery of the cathode electrode and then the thus generated conductive area expands throughout the whole body of the thyristor with the lapse of time.

Accordingly, if the rate of rise of the forward current, i.e. di/dt, is large, a large forward current flows through a small conductive region. As a result, the current density becomes so high that the power loss in the conductive region becomes considerable. In some extreme cases, it may happen that the thyristor is destroyed by the conduction current having so high a density. In order to prevent such a fault, therefore, various gate structures have been proposed. One of the typical examples of such gate structures is an amplifying gate structure.

FIG. 1 shows an example of the amplifying gate structure and FIG. 2 shows the equivalent circuit of the exemplary structure in FIG. 1. When a trigger signal is applied between a gate electrode 4 and a cathode electrode 2, with a forward voltage applied between the cathode electrode 2 and an anode electrode 3, gate current $i_G$ flows through a path: the gate electrode 4—p base 9—auxiliary n emitter 12—auxiliary cathode electrode 5—p base 9—main n emitter 8—the cathode electrode 2. Accordingly, an auxiliary region 14 first turns on to cause an auxiliary current $i_a$ to flow. The auxiliary current causes a thyristor region 15 having a large area under the auxiliary cathode electrode 5, to turn on so that a main current $i_b$ flows. The forward current in the early stage of the turn-on period is therefore divided into two components; one flowing through the auxiliary thyristor region and the other through the main thyristor region. Namely, the switching energy is shared to the two regions, whereby the di/dt capability in the early stage of the turn-on period can be made rather large.

Thus, the amplifying gate structure has proved to relatively improve the di/dt capability. However, even in such a thyristor as having an amplifying gate structure, electrical and/or thermal injury and/or breakdown in the auxiliary thyristor or in the vicinity thereof are liable to take place to meet the recently increasing requirements for withstanding high voltages, treating large currents and operating at high speeds. Hence, it is difficult to attain a sufficient di/dt capability. The reason for this is as follows.

The di/dt capability of a thyristor having an amplifying gate structure is determined depending on the larger one of the switching energies consumed per unit area of the conducting region of the auxiliary thyristor 14 and per unit area of the conducting region of the main thyristor 15, in the early stage of the conducting period.

Accordingly, if the resistance value of the resistor $R_G$ shown in FIG. 2 is small, a sufficient gate current is supplied for the main thyristor 15 from the auxiliary thyristor 14. Therefore, by making the opposite portions of the auxiliary cathode electrode 5 and the main n emitter 8 sufficiently long, it is probable that the initial conduction area will be easily increased and that the temperature rise will also be limited. In the case of the auxiliary thyristor, however, the lengths of the parallelling portions of the gate electrode 4 and the auxiliary n emitter 12 are made large, a large gate current is needed. For a small gate current remarkably causes uneven starts of turn-on periods and local turn-ons in the auxiliary thyristor 14 so that the initial conduction area cannot be increased. Also, since the auxiliary current $i_a$ continues to flow through the auxiliary thyristor 14 even after the main thyristor 15 has been turned on, the increase in the di/dt of the main current necessarily causes the increase in the auxiliary current. This is a drawback that the switching energy consumed in the auxiliary thyristor 14 further increases. On the other hand, if the resistance of the resistor $R_G$ in FIG. 2 is made large, the current through the auxiliary thyristor 14 can be decreased to a certain extent. In this case, however, the heat generated by the transverse resistance $R_G$ becomes appreciable and also the gate current injected into the gate of the main thyristor 15 becomes small so that the turn-on of the thyristor 15 is delayed. And since most of the auxiliary current $i_a$ flows through the auxiliary thyristor 14 until the main thyristor 15 has been turned on, the switching energy consumed by the auxiliary thyristor 14 cannot be increased.

As apparent from the above description, even with a thyristor having a conventional amplifying gate structure, if the rate di/dt of rise of the anode current ($i_a$–$i_b$) is high, electrical and/or thermal injury and/or breakdown will take place in the auxiliary thyristor or in the vicinity thereof.

In order to prevent such electrical and/or thermal damage to the auxiliary thyristor, some measures have been proposed. For example, U.S. Pat. No. 3,526,815 (issued to P. Svedberg et al) discloses the insertion of a resistor between the main and the auxiliary thyristor (FIG. 6) and the Japanese Patent Appln. Laid-Open No. 135478/76 teaches the insertion of an inductance between the main and the auxiliary thyristor (FIG. 2). These and other methods hitherto proposed, however, seem still unsatisfactory.

SUMMARY OF THE INVENTION

The object of this invention is to provide a thyristor free from the above described drawbacks, having a large current rise rate capability, i.e. di/dt capability, during the turn-on period.

According to this invention, which has been made to attain the above object, the gate current is supplied to the peripheral portions of the emitter under the cathode through the auxiliary emitter of the auxiliary thyristor and the capacitor connected with the auxiliary emitter. As a result, the auxiliary current flowing through the auxiliary thyristor which was turned on, is supplied to the same peripheral portion through the capacitor to turn the main thyristor on. However, when the capacitor has been charged up, the auxiliary current is interrupted to swiftly reduce the current flowing through the initial firing region in the amplifying auxiliary thyristor wherein the temperature reaches the highest point.

As described just above, according to this invention, a large current having a steep rise characteristic is caused to flow in or near the peripheral portion of the emitter under the cathode so as to initiate the turn-on over a large area and after the turn-on the current through the initial turn-on region of the amplifying auxiliary thyristor is rapidly reduced. Thus, the present invention can provide a thyristor having a large di/dt capability.

BRIEF DESCRIPTION OF THE DRAWINGS

FIGS. 5a and 5b are respectively a plan view of a second embodiment of this invention and a cross section taken along line Vb—Vb in FIG. 5a.

DESCRIPTION OF THE PREFERRED EMBODIMENTS

Figure 3:
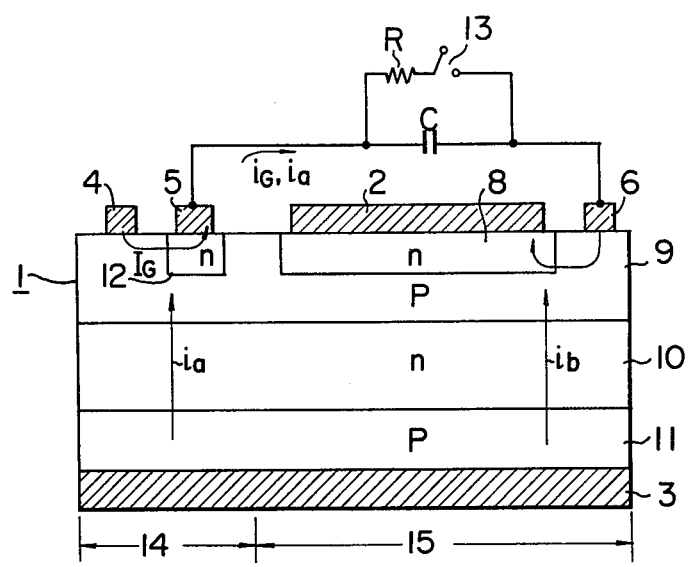
FIG. 3 shows in cross section an amplifying gate type thyristor as a first embodiment of this invention.
Figure 4:
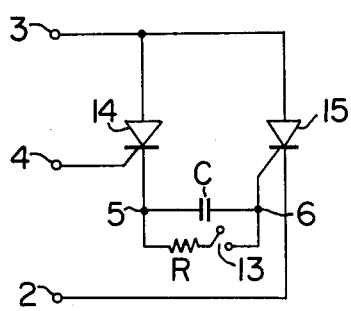
FIG. 4 is the equivalent circuit of the thyristor shown in FIG. 3.

FIG. 3 schematically shows in cross section an amplifying gate type thyristor as an embodiment of this invention and FIG. 4 is the equivalent circuit of the thyristor. An auxiliary cathode electrode 5 is provided on an auxiliary n emitter 12 provided separately from a main n emitter 8 kept in contact with a cathode electrode 2 and a second gate electrode 6 is provided on a p base 9, parallel to the main n emitter 8. The auxiliary cathode electrode 5 and the second gate electrode 6 are connected with each other by a capacitor C. The capacitor C is shunted by a series circuit of a resistor R and a switch 13 for discharging the capacitor C.

The turn-on operation of the thyristor will now be described with the aid of the drawings. Initially, the switch 13 is opened. When a forward voltage is applied between the gate electrode 4 and the cathode electrode 2, with a forward voltage applied between an anode electrode 3 and the cathode electrode 2, a gate current $i_G$ flows through a path: gate electrode 4—p base 9—auxiliary n emitter 12—auxiliary cathode electrode 5—capacitor C—second gate electrode 6—p base 9—main n emitter 8—and cathode electrode 2, as shown in FIG. 3. Accordingly, an auxiliary thyristor region 14 for amplification first turns on to cause an auxiliary current $i_a$ to flow as shown in FIG. 3. The auxiliary current $i_a$ flows through a path: auxiliary cathode electrode 5—capacitor C—second gate electrode 6 P base 9—main n emitter 8 and cathode electrode 2, so that in a main thyristor region 15 the turn-on is initiated in the large-area peripheral portion of the main n emitter 8 opposite to the second gate electrode 6, to cause a main current $i_b$ to flow. As the capacitor C is charged, the auxiliary current $i_a$ rapidly decreases. After the conduction region has sufficiently expanded from the peripheral portion of the main n emitter, the switch 13 is closed or turned on to discharge the electric charges stored in the capacitor C through a rather high resistance R. When the main thyristor 15 is cut off, the switch is again opened or turned off to prepare for the next turn-on. The capacitor C has only to be discharged during a period from the initial turn-on instant of the main thyristor 15 to the next turn-on instant of the auxiliary thyristor 14 and the function of the switch 13 can be realized in the semiconductor substrate, as described later, by using the operation of the thyristor.

The supply of the auxiliary current to the main n emitter 8 through the capacitor C can produce the following effects.

(1) When a forward voltage is applied between the gate electrode 4 and the cathode electrode 2, the impedance of the capacitor C is low so that a sufficiently large current with rapid rise characteristic can be supplied to the main n emitter 8.

(2) Since the current flowing through the auxiliary thyristor 14 for amplification which is initially turned on is liable to be easily destroyed, the current rapidly reduces after the main thyristor has been turned on, thus the temperature rise in the auxiliary thyristor can be rendered low and a very high di/dt capability can be obtained.

FIGS. 5a and 5b show an amplifying gate type thyristor as a second embodiment of this invention, in which the series circuit of the switch 13 and the resistor R is integrally formed in the semiconductor substrate. This embodiment differs from that shown in FIG. 3 only in that the auxiliary cathode electrode 5 has a portion 7 serving as a discharging path for the capacitor C, which portion is in contact with the p base 9. The auxiliary cathode electrode 5, the discharging path 7, the p base 9 and the second gate electrode 6 constitute a resistor R' for discharging the capacitor C and the resistance of the resistor R' is made rather high. Accordingly, when a gate signal is supplied to the gate electrode 4, most of the resulting current flows through the capacitor and only a small fraction of the current flows through the discharging resistor. When the auxiliary thyristor 14 for amplification is turned on to cause the main thyristor to turn on, the capacitor C is charged to develop a voltage of several tens of volts thereacross.

Accordingly, the potential at the portion of the p base 9 under the auxiliary cathode electrode 5 rises so that current flows from that portion to the portion of the main n emitter 8 opposite to the auxiliary n emitter 12, to initiate turn-on. In this case, conductivity modulation takes place in the portions of the p base layer 9 between the second gate electrode 6 and the cathode electrode 2 and between the cathode electrode 2 and the auxiliary cathode electrode 5 so that the resistance of the resistor R' is reduced. Consequently, the electric charges stored in the capacitor C are released through the discharging resistor R'.

The experiments have showed that without the discharging path 7 the capacitor C is discharged in about several hundreds of microseconds due to the leakage current etc. Therefore, such a discharging path need not be always provided in a thyristor to be operated at the commercial frequency. Also, instead of connecting the capacitor as a discrete element externally, an integral equivalent may be formed by successively disposing a dielectric layer and a capacitor electrode on the second gate electrode 6 or the auxiliary cathode electrode 5. According to the experiments by the inventors, the appropriate range of capacitance of the capacitor C is determined in relation to the rise rate of the anode current at the time of turn-on of the thyristor.

During the delay time (several microseconds) from the turn-on of the auxiliary thyristor 14 to that of the main thyristor 15 and the rise time of the anode current when the voltage between the anode electrode 3 and the cathode electrode 2 is reduced to several tens volts, the capacitor C is charged by the auxiliary current $i_a$. When the capacitance of the capacitor C is low, it is over-charged until when the anode-cathode voltage is decreased to the above value with the result that the voltage across the capacitor C becomes excessively high. This may result in the breakdown of the n emitter-p base junction and the capacitor C. On the other hand, when the capacitance of the capacitor C is high, the charging current for the capacitor C is increased to raise the switching capability in the auxiliary thyristor 14. Thus, the appropriate range of the capacitance of the capacitor C is determined as follows. Assume that the greatest rise of the anode current to be permitted is $di_A/dt$ (A/μs), the delay time of the main thyristor 15 td(μs), the rise time of the anode current tr(μs) and the capacitance of the capacitor C(μF). It is necessary to flow the current through the capacitor into the main thyristor 15 during the delay time thereof and decrease the voltage across the capacitor below the breakdown voltage of the n emitter-p base junction and the capacitor at the end of the delay time. When the greatest permissible voltage across the capacitor is $V_{C1}$, the lower limit $C_1$ of the capacitance of the capacitor is given by the following expression.

$$C_1 \geq \frac{\alpha \cdot td^2}{2 \cdot V_{C1}} \left( \frac{di_A}{dt} \right)$$

where α is a fixed value determined by the waveform of the anode current during the delay time of the main thyristor 15. The actual rise rate $di_A/dt$ of the anode current is lower than the value obtained by calculation, and $\alpha \approx 0.4$. The delay time even after the gate current has flowed for longer time is at least about 1.2 μs. The greatest permissible voltage across the capacitor C must be lower than 200 V. Accordingly, the following expression is obtained.

$$C_1 \geq 0.0015(di_A/dt)$$

where the respective dimensions of the capacitor C, and the rise rate of the anode current $di_A/dt$ are μF, A/μs.

Next, explanation will be made about the upper limit of the capacitance of the capacitor C. When the capacitance of the capacitor C is higher, current flows through the capacitor C even after the main thyristor 15 is turned on, and unnecessary switching loss in the auxiliary thyristor 14 results. The auxiliary current $i_a$ flowing into the main thyristor 15 has only to flow till the end of the rise time of the anode current. After that time it is not necessary for the auxiliary current $i_a$ to flow. To this end, the charging voltage across the capacitor C should be much greater than the anode-cathode voltage at the end of the rise time of the anode current. Thus, most of the anode current flows through the main thyristor 15 instead of the auxiliary thyristor 14 due to this charged voltage across the capacitor. When it is assumed that the lowest permissible value of the voltage across the capacitor at the end of the rise time of the anode current is $V_{c2}$, and the rise time tr (μs), the upper limit of the capacitance of the capacitor C is given by the following expression.

$$C_2 \leq \frac{\alpha \cdot td(td + tr) + \beta tr^2}{2 \cdot V_{c2}} \left( \frac{di_A}{dt} \right)$$

In the above expression, the rise time tr (μs) is at most 3 μs even in thyristor having high breakover voltage. Since the forward voltage drop of the thyristor in the stationary state is several volts, the lowest permissible voltage limit $V_{c2}$ must be at least 20 volts. Further, the fixed value is the dividing ratio of the anode current between the main thyristor 15 and the auxiliary thyristor 14 and must be selected to be lower than 0.2. When this is higher, the switching loss in the auxiliary thyristor 14 is increased. Accordingly, the following expression is obtained as to the upper limit of the capacitance of the capacitor C.

$$C_2 \leq 0.15(di_A/dt)$$

where the respective dimensions of the capacitance $C_2$ and the rise rate of the anode current are μF and A/μs.

With $di_A/dt = 100$ A/μs, 0.15 μF ≤ C ≤ 15 μF.

Figure 6:
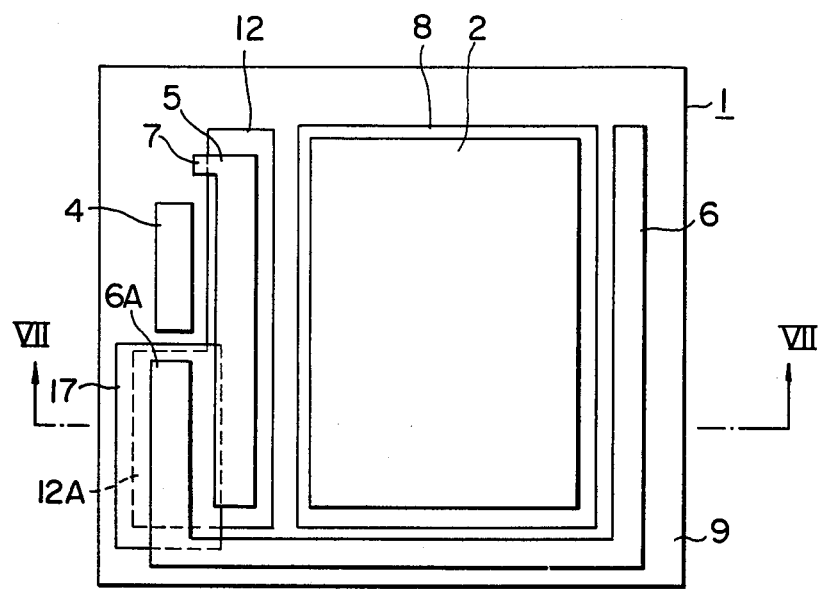
FIG. 6 is a plan view of a thyristor as a third embodiment of this invention.
Figure 7:
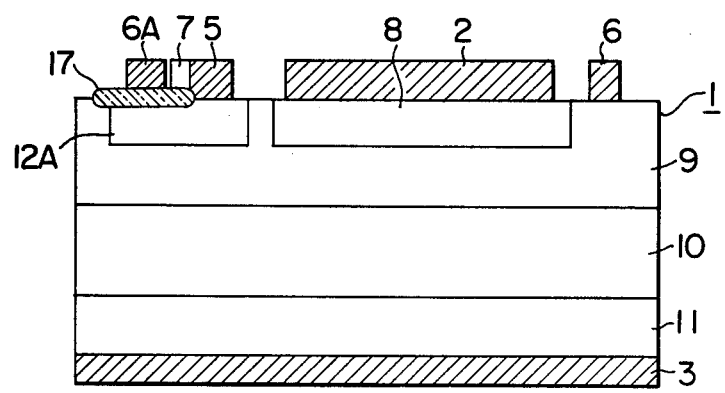
FIG. 7 is a cross-sectional view taken along line VII—VII in FIG. 6.

FIGS. 6 and 7 show respectively in plan and cross section an amplifying gate type thyristor as a third embodiment of this invention, in which the capacitor C is formed integrally in the semiconductor substrate. This embodiment differs from the second embodiment only in that the capacitor is formed in the semiconductor substrate in an IC configuration. Namely, the auxiliary n emitter 12 is extended and enlarged to form the bottom electrode 12A of the capacitor C and a dielectric layer 17 is formed on the bottom electrode 12A. On the other hand, the second gate electrode 6 is extended onto the dielectric layer 17 so as to form the top electrode 6A of the capacitor. By this configuration, the capacitor C and its associated wiring conductors are integrated. The operation of this thyristor is the same as that of the second embodiment and therefore not repeatedly described. A film of silicon oxide SiO₂ is preferably used as such a dielectric layer 17. The SiO₂ film can be formed by heating silicon in an atmosphere of oxygen with a small amount of water vapor. The location of the SiO₂ film in the desired position or the patterning of SiO₂ film is effected by the well-known photoetching technique. By forming a metal electrode on the SiO₂ film through vacuum vapor-deposition, a capacitor is completed.

Figure 8:
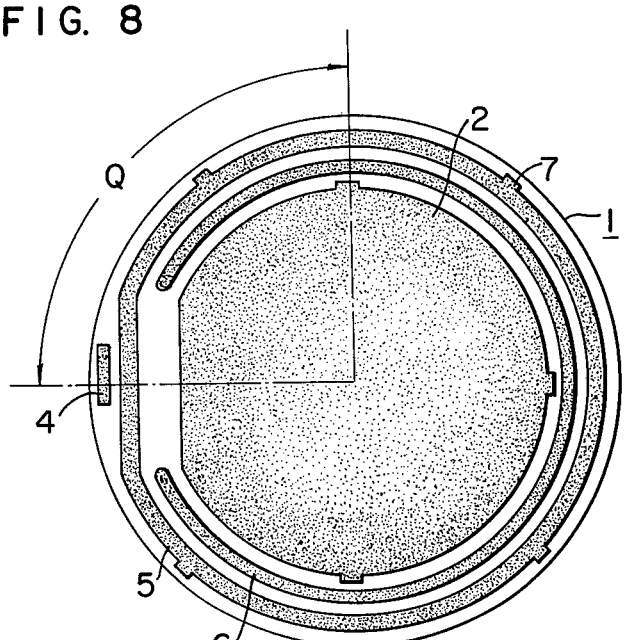
FIG. 8 shows the patterns of electrodes used in a thyristor as a fourth embodiment of this invention.
Figure 9:
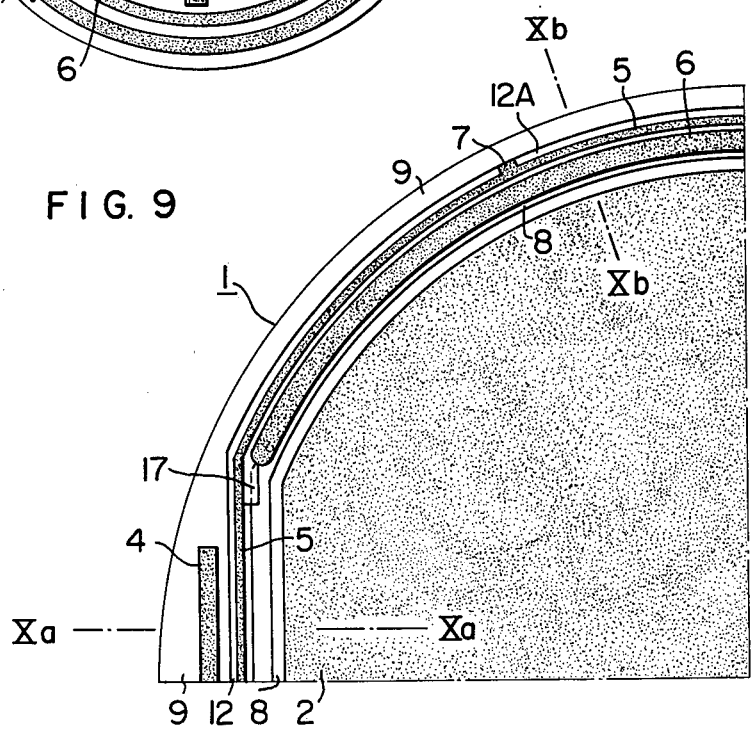
FIG. 9 shows on a magnified scale a portion of the electrode patterns shown in FIG. 8.
Figure 10A:
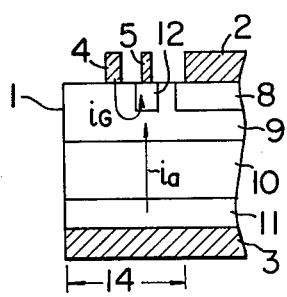
FIGS. 10a and 10b are respectively cross-sectional views taken along lines Xa—Xa and Xb—Xb in FIG. 9.
Figure 10B:
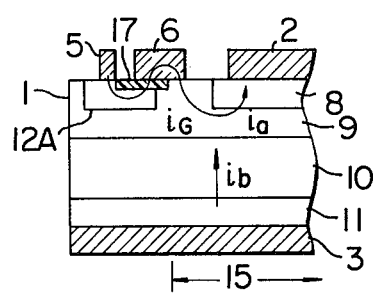

FIG. 8 shows in plan the electrode pattern of an amplifying gate structure as a fourth embodiment of this invention, applied to a thyristor. FIG. 9 shows on an enlarged scale about a quarter portion Q of the thyristor shown in FIG. 8. FIGS. 10a and 10b are respectively cross sections taken along lines Xa—Xa and Xb—Xb. As in the embodiment shown in FIG. 6, the capacitor C is constituted of the bottom electrode 12A as the extended portion of the auxiliary emitter 12, the SiO₂ film 17 formed on the bottom electrode 12A, and the top electrode as a portion of the second gate electrode 6 concentrically provided between the cathode electrode 2 and the auxiliary cathode electrode 5. When a forward voltage is applied between the gate electrode 4 and the cathode electrode 2, the gate current $i_G$ flows through a path: gate electrode 4—p base 9—auxiliary n emitter 12—auxiliary cathode electrode 5—capacitor C—second gate electrode 6—p base 9—main n emitter 8—cathode electrode 2, as shown in FIGS. 10a and 10b. Accordingly, the auxiliary thyristor 14 is turned on to cause the auxiliary current $i_a$ to flow through a path: cathode electrode 5—capacitor C—second gate electrode 6—p base 9—main n emitter 8—cathode electrode 2. Consequently, the peripheral portion of the cathode electrode opposite to the second gate electrode 6 fires over a large area. In this case, the discharging path 7 for the capacitor C is formed by extending a portion of the auxiliary cathode electrode 5 until it reaches the p base 9 and then by bringing them into ohmic contact with each other. The capacitance of the capacitor C is given by the following expression.

$$C = \frac{\epsilon \cdot A}{d},$$

where d is the thickness of the silicon oxide film, A the area of the electrodes and $\epsilon$ the dielectric constant of the silicon oxide film (i.e. $0.34 \times 10^{-4}$ μF/cm).

For example, if d=1 μm and A=1 cm², the capacitance C of a capacitor thus formed equals 0.34 μF. The withstand voltage of the capacitor is about 100 V. A capacitance of about 0.3 μF will provide a gate current sufficient to fire the main thyristor. Concerning this, the results of the actual measurements will be given later. In this embodiment, the gate electrodes are provided on the peripheral portion of the substrate, but it should be noted that the present invention can also be applied to the case where the gates are provided in the central portion of the substrate surface.

Figure 1:
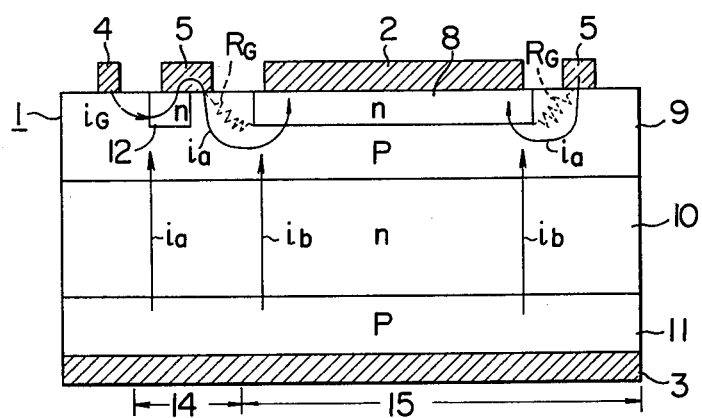
FIG. 1 shows in cross section a conventional amplifying gate type thyristor.
Figure 2:
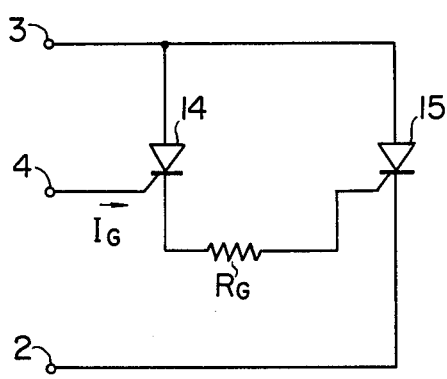
FIG. 2 is the equivalent circuit of the thyristor shown in FIG. 1.
Figure 11A:
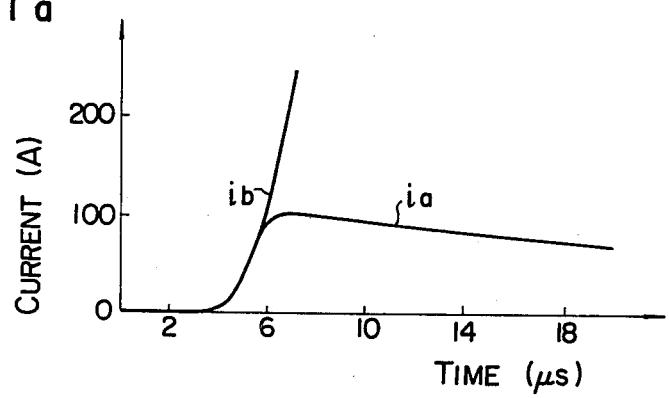
FIGS. 11a to 11c show the waveforms of the auxiliary currents and the main currents during the turn-on periods of a conventional amplifying gate type thyrisor and an amplifying gate type thyristor embodying this invention.
Figure 11B:
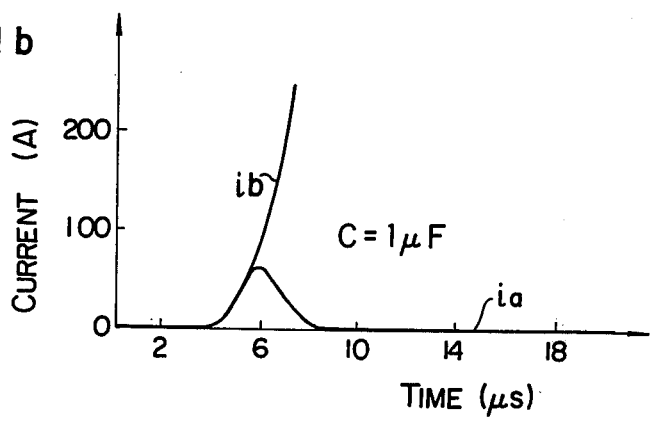
Figure 11C:
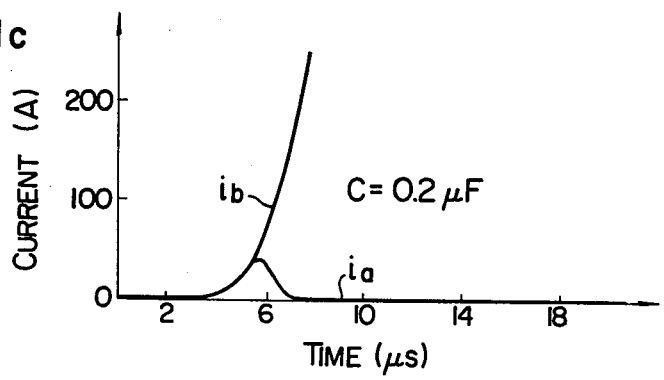

FIG. 11a shows the actually measured changes with time in the auxiliary current $i_a$ and the main current $i_b$ flowing during the turn-on period through a conventional amplifying gate type thyristor (shown in FIG. 1) and FIGS. 11b and 11c show the actually measured changes with time in the auxiliary currents $i_a$ and the main currents $i_b$ flowing during the turn-on periods through amplifying gate type thyristors (shown in FIG. 3) according to this invention. Each of the thyristors subjected to the measurements have a diameter of 60 mm, a forward blocking voltage of 4 KV, a conduction current of 800 A and an auxiliary emitter with an area of about 2 cm². The capacitance of the capacitor C is 1 μF in the thyristor shown in FIG. 11b and 0.2 μF in the thyristor shown in FIG. 11c.

In the case of the conventional thyristor, as shown in FIG. 11a, only a small amount of the auxiliary current $i_a$ is decreased even after the main thyristor has been fired to draw the main current $i_b$. On the other hand, in the case of the thyristors according to this invention, as shown in FIGS. 11b and 11c, the auxiliary current $i_a$ is steeply decreased after the main thyristor has been fired, so that the switching power consumed in the auxiliary thyristor can be decreased to a considerable extent. Further, even though the auxiliary current $i_a$ is decreased after the main thyristor has been fired, the change in the auxiliary current $i_a$ has little influence on the manner in which the main thyristor is fired. This is evident from the fact that the rise characteristic of the main (anode) current $i_b$ through the conventional thyristor is almost the same as that of the anode current $i_b$ through the thyristor according to this invention, as seen from FIGS. 11a to 11c. In these examples, the capacitor should preferably have a capacitance of 0.1–1 μF.

Figure 12A:
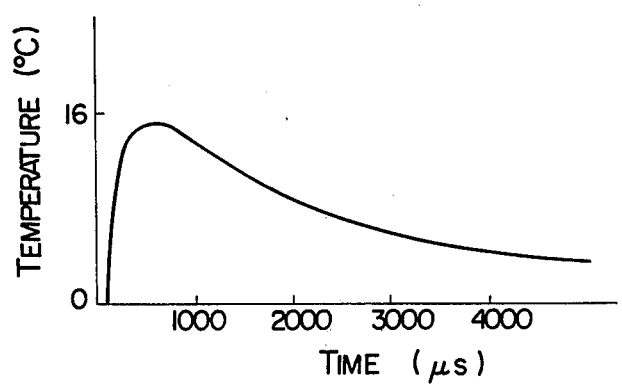
FIGS. 12a and 12b respectively show the temperature rises in the auxiliary thyristor sections of a conventional amplifying gate type thyristor and an amplifying gate type thyristor embodying this invention.
Figure 12B:
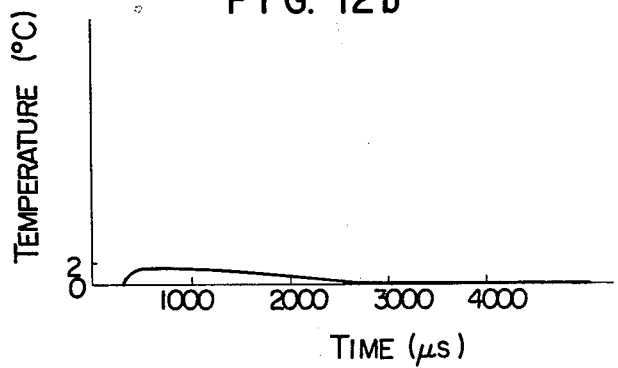

FIGS. 12a and 12b show, respectively, the actually measured changes with time in the temperatures in the auxiliary thyristors of the conventional thyristor and the thyristor according to this invention, with di/dt equal to 125 A/μs. In the conventional amplifying gate type thyristor, the temperature rises up to the maximum value of 16° C. while the highest temperature is 1.5° C., i.e. one tenth of the maximum value of the conventional thyristor, in the thyristor (C=0.2 μF) according to this invention. Since sufficient gate currents flow through the main thyristor sections of both thyristors, the degrees of temperature rise in the main thyristor sections of the conventional and the present thyristor are both the same. As described above, this invention has a great effect of improving the di/dt capability.

Throughout this specification, this invention is described as applied to the cases in each of which the auxiliary and main thyristor sections 14 and 15 are integrally formed in a single semiconductor substrate, but it should be understood by those skilled in the art that this invention can also be applied equally to any case where the sections are formed respectively in separate semiconductor substrates.

We claim:

1. An arrangement for increasing the current rise rate capabilities of a pnpn-type switching thyristor, comprising:

an auxiliary thyristor consisting of two outer and two intermediate semiconductor layers of alternate conductivity type, with a pn junction defined between any two adjacent layers, and said auxiliary thyristor having a pair of main surfaces on the opposite sides and also having an anode electrode affixed to one of said outer layers, a cathode electrode affixed to the other one of said outer layers and a gate electrode affixed to one of said intermediate layers;

a main thyristor consisting of two outer and two intermediate semiconductor layers of alternate conductivity types, with a pn junction defined between any two adjacent layers, and said main thyristor having a pair of main surfaces on the opposite sides and also having an anode electrode affixed to one of said main outer layers, a cathode electrode affixed to the other of said main outer layers and a gate electrode affixed to one of said main intermediate layers;

said main and auxiliary cathode electrodes and said main and auxiliary gate electrodes each being separate from and spaced from the others;

means for connecting said anode electrodes of said auxiliary and main thyristors in common;

a capacitor; means connecting said capacitor between said cathode electrode of said auxiliary thyristor and said gate electrode of said main thyristor with said connection being external of said layers;

a control current input directly connected to said auxiliary gate electrode;

two load terminals, respectively, directly connected to said main cathode electrode and said main anode electrode;

said control current input, said auxiliary gate electrode, said auxiliary one intermediate layer, said auxiliary other outer layer, said auxiliary cathode electrode, said capacitor, said main gate electrode, said main one intermediate layer, said main other outer layer, said main cathode electrode, and one of said load terminals being in named order series circuit so that control current will flow from said control current input through said series circuit to said main cathode electrode during charging of said capacitor and switching of said main thyristor, and so that with full charging of said capacitor there will be blocking of further current flow through said main thyristor gate electrode; and means for discharging the electric charges stored in said capacitor.

2. A thyristor arrangement as claimed in claim 1, wherein said main one outer layer and said auxiliary one outer layer are together a single common semiconductor layer; said main one intermediate layer and said auxiliary one intermediate layer are a single common semiconductor layer; the other auxiliary intermediate layer and the other main intermediate layer are a single common semiconductor layer; said auxiliary other outer layer being spaced from, separate from and smaller than said main other outer layer; said auxiliary gate electrode being closer to said auxiliary cathode electrode than said main cathode electrode; and said main gate electrode being closer to said main cathode electrode than said auxiliary cathode electrode.

3. A thyristor arrangement as claimed in Claim 2, wherein said capacitor consists of a bottom electrode formed by extending and expanding said auxiliary cathode electrode, a dielectric layer formed on said bottom electrode and a top electrode formed on said dielectric layer by extending said main gate electrode onto said dielectric layer.

4. A thyristor arrangement as claimed in claim 3, wherein said auxiliary cathode electrode is disposed extending along the periphery of said main cathode electrode and said main gate electrode is disposed concentrically between said main cathode electrode and said auxiliary cathode electrode.

5. A thyristor as claimed in claim 3 or 4, wherein the capacitance ($\mu$F) of said capacitor is $$0.0015 \left( \frac{di_A}{dt} \right) \leq C \leq 0.15 \left( \frac{di_A}{dt} \right)$$

where $di_A/dt$ is the permissible greatest rising rate of anode current of the thyristor.

6. A thyristor arrangement as claimed in claim 1 or 2, wherein said discharging means is a series circuit of a switch and a resistor, said series circuit shunting said capacitor.

7. A thyristor arrangement as claimed in claim 2, wherein said discharging means is integrally formed in said intermediate layer between said auxiliary cathode electrode and said main gate electrode.

* * * * *